United States Patent
Chou

(10) Patent No.: US 6,710,727 B1
(45) Date of Patent: Mar. 23, 2004

(54) CORRECTION SYSTEM AND METHOD OF SUCCESSIVE APPROXIMATION A/D CONVERTER

(75) Inventor: Kuo-Yu Chou, Hsinchu (TW)

(73) Assignee: Novatek Microelectronic Co., Hsin Chu (TW)

( * ) Notice: Subject to any disclaimer, the term of this patent is extended or adjusted under 35 U.S.C. 154(b) by 0 days.

(21) Appl. No.: 10/369,643

(22) Filed: Feb. 21, 2003

(30) Foreign Application Priority Data

Dec. 27, 2002 (TW) ........................................ 91137774 A

(51) Int. Cl.[7] .............................................. H03M 1/10
(52) U.S. Cl. ........................ 341/120; 341/118; 341/155
(58) Field of Search ................................ 341/118, 120, 341/155

(56) References Cited

U.S. PATENT DOCUMENTS

| | | | | |
|---|---|---|---|---|
| 5,345,235 A | * | 9/1994 | Babcock | 341/155 |
| 6,232,899 B1 | * | 5/2001 | Craven | 341/155 |
| 6,384,757 B1 | * | 5/2002 | Kosonen | 341/120 |
| 6,492,923 B1 | * | 12/2002 | Inoue et al. | 341/120 |
| 6,542,101 B1 | * | 4/2003 | Kolsrud | 341/155 |
| 6,621,435 B2 | * | 9/2003 | Cusinato et al. | 341/155 |
| 6,642,871 B2 | * | 11/2003 | Takeyabu et al. | 341/120 |

* cited by examiner

Primary Examiner—Michael Tokar
Assistant Examiner—Lam T. Mai
(74) Attorney, Agent, or Firm—Troxell Law Office PLLC

(57) ABSTRACT

The present invention provides a correction system and method for a Successive Approximation A/D Converter (SA-ADC) of the prior art. The operation method of the correction system is described in the following: (1) Using the SA-ADC of the prior art to convert an analog signal to a digital data. The digital data is a series of logic numbers. (2) Detecting the last number of the digital data is logic number [0] or logic number [1]. (3-1) When the last number is logic number [1], proceeding the digital data and logic number [1] with an addition operation to generate a first detection digital data. Converting the first detection digital data to a first detection signal for comparing with the analog signal. If the analog signal is higher than the first detection signal, then replacing the digital data by the first detection digital data. If the analog signal is lower than the first detection signal, then outputting the digital data without correcting. (3-2) When the last number is logic number [0], using the digital data to detect directly. Converting the digital data to a second detection signal for comparing with the analog signal. If the analog signal is higher than the second detection signal, then outputting the digital data without correcting. If the analog signal is lower than the first detection signal, then proceeding the digital data and logic number [1] with a subtraction operation to generate a second detection digital data to replace the digital data.

21 Claims, 3 Drawing Sheets

CORRECTION SYSTEM AND METHOD OF SUCCESSIVE APPROXIMATION A/D CONVERTER

BACKGROUND OF THE INVENTION

1. Field of the Invention

The present invention relates to a correction system of an A/D converter, and more particularly to a correction system of a Successive Approximation A/D Converter (SA-ADC).

2. Description of the Prior Art

The Successive Approximation A/D Converter (SA-ADC) of the prior art uses the dichotomy to find the corresponding digital value of the analog signal stage by stage. Basically, the outputting way of the SA-ADC is a series of outputting as well as outputting one bit per time from high bit to low bit. The converting rate of the SA-ADC is approximately 10 khz to 100 khz, and the resolution is approximately 10~16 bits.

Please refer to FIG. 1. FIG. 1 is a schematic diagram of the SA-ADC 10 in the prior art. The basic structure of the SA-ADC in the prior art comprises a comparator 12, a register 14, a D/A converter 16, and a control unit 18. The operation steps of the SA-ADC of the prior art are shown in the following. The first step, the middle value of the comparison range of the comparator 12 (e.g. the comparison range is 0~3V, and then the middle value is 1.5V) is converted to the highest bit of the SA-ADC 10 and buffered into the register 14. Then, the register 14 inputs the value into the D/A converter 16 to convert to a middle voltage. The D/A converter 16 inputs the voltage into the comparator 12 to be a reference signal of the comparator and be compared with the level of the analog signal. If the level of the analog signal is higher than the middle voltage, the logic number [1] is output to represent the MSB of the analog signal. If the level of the analog signal is lower than the middle voltage, the logic number [0] is output to represent the MSB of the analog signal.

The second step, the result of the first step is input into the register 14 by the comparator 12, and the register 14 feeds back the result to the D/A converter 16 to correct the reference signal of the comparator 12 before next comparison. The correction method is: If the first step outputs the logic number [1], the voltage, which is converted by the D/A converter 16, will be the average value of the middle voltage of the SA-ADC and the upper bond of the comparison range (e.g. if the comparison range is 0~3V, the middle voltage is 1.5V, and the average value of the middle voltage and the upper bond is 2.25V), and the comparator 12 compares the voltage with the level of the analog signal. If the first step outputs the logic number [0], the voltage, which is converted by the D/A converter 16, will be the average value of the middle voltage of the SA-ADC and the lower bond of the comparison range (e.g. if the comparison range is 0~3V, the middle voltage is 1.5V, and the average value of the middle voltage and the upper bond is 0.75V), and the comparator 12 compares the voltage with the level of the analog signal.

And so on, under the clock of the control unit 18 driving (one converting per clock), the SA-ADC changes the reference voltage continuously to compare with the analog signal until the converting of the LSB is finished. As the above, because every converting will reduce the comparison range to a half (the comparison range of the first step is 0~3V, and the comparison range of the second step is reduced to 1.5~3V or 0~1.5V), the output generated by the last converting will approach ±1 LSB of the analog signal. When every bit of the analog signal is confirmed, the converting result will be buffered into the register 14 and be the output of the SA-ADC 10.

One factor of affecting the function of the SA-ADC is the D/A converter inside, because the Settling Time and Accuracy thereof limit the function of the SA-ADC. Due to the lack of the correction mechanism of the SA-ADC in the prior art, when the D/A converter does not have enough settling time or sufficient accuracy, the SA-ADC will output a result with an error. The sources of an error of the settling time and the accuracy may come from the devices mismatch or the overhigh converting rate of the SA-ADC. Therefore, the D/A converter cannot achieve the request of accuracy of ±½ LSB.

The devices mismatch cannot be corrected by a circuit but can be avoided by a circuit layout. The rate of the D/A converter can be improved by a circuit method, but more waste current and larger chip area are necessary. Therefore, if a correction mechanism is provided to the SA-ADC, one clock may be increased to make the D/A converter stably and reduce the request of subordinate circuit.

U.S. Pat. No. 4,620,179, the process of the SA-ADC is divided into two steps. The first step solves the front bit of the analog signal (CODE=X), and the second step uses the three voltage values corresponding to three front bits CODE=X+1, CODE=X, and CODE=X-1 as the reference signals of the comparator to compare with the analog signal and correct the front bit. In other words, this patent extends one unit from plus to minus for the comparison range corresponding to the front bit, which is solved by the first step, to achieve the objective of correcting the bit of the first step. For example, if the SA-ADC is 4 bits resolution, each of two steps solves 2 bits respectively. If the logic number solved by the first step is 10, at the second step, three voltage values of the logic numbers 11, 10, and 01 will be compared with the analog signal respectively to correct the result of the first step. By this method, the request of the settling time and the accuracy of the D/A converter in the first step is reduced. However, more delay time and more complex control logic are necessary than the prior art. The error cannot be corrected when the error occurs in the bit of the second step.

SUMMARY OF THE INVENTION

Accordingly, an objective of the present invention is to provide a correction system of a Successive Approximation Analog-to-Digital Converter (SA-ADC), which solves the problems generated by the prior art.

Another objective of the present invention is to provide a correction system of the SA-ADC, which has a simplified control logic and doesn't increase the delay time of the converter.

Another objective of the present invention is to provide a correction system of the SA-ADC, which can output complete and accurate digital data.

The present invention is a correction system of a Successive Approximation Analog-to-Digital Converter (SA-ADC). The converter is used for converting an analog signal to a digital data. The digital data is a series of N logic numbers $D_i (i=1\sim N)$ and has the same M logic numbers $(D_{N-M+1} \sim D_N, 1 \leq M < N)$ in the last. The correction system is used for detecting if there is any error within the digital data after the digital data is generated, and correcting the digital data. The correction system comprises a detection module, a D/A converter, and a comparator for correcting the digital data under the following two conditions.

If the M logic numbers are the logic number [1]:

The detection module is used for proceeding the digital data and the logic number [1] with an addition operation to generate a first detection digital data. The D/A converter is used for receiving the first detection digital data and converting to a first detection signal correspondingly. The comparator is used for using the first detection signal as a reference signal of the comparator to compare with the analog signal. If the analog signal is higher than the first detection signal, the detection module outputs the first detection digital data to replace the digital data. If the analog signal is lower than the first detection signal, the detection module outputs the digital data.

If the M logic numbers are the logic number [0]:

The detection module uses the digital data to detect directly. The D/A converter is used for receiving the digital data and converting to a second detection signal correspondingly. The comparator is used for using the second detection signal as a reference signal of the comparator to compare with the analog signal. If the analog signal is higher than the second detection signal, the detection module outputs the digital data. If the analog signal is lower than the second detection signal, the detection module proceeds the digital data and the logic number [1] with a subtraction operation to output a second detection digital data to replace the digital data.

Therefore, because the present invention adds a correction mechanism under the structure of the SA-ADC in the prior art, the request of the D/A converter inside is reduced and the problems resulted from that the SA-ADC of the prior art lacks the correction mechanism are avoided. And because the present invention adds one clock directly under the structure of the conventional SA-ADC, the control logic is more simplified than the prior art. Extending the correction clock, which increases the time for the stability of the D/A converter, may further reduce the request of the D/A converter. Besides, the correction system of the present invention aims to correct the digital data of the whole SA-ADC, so the accuracy of the data output from the SA-ADC can be ensured.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
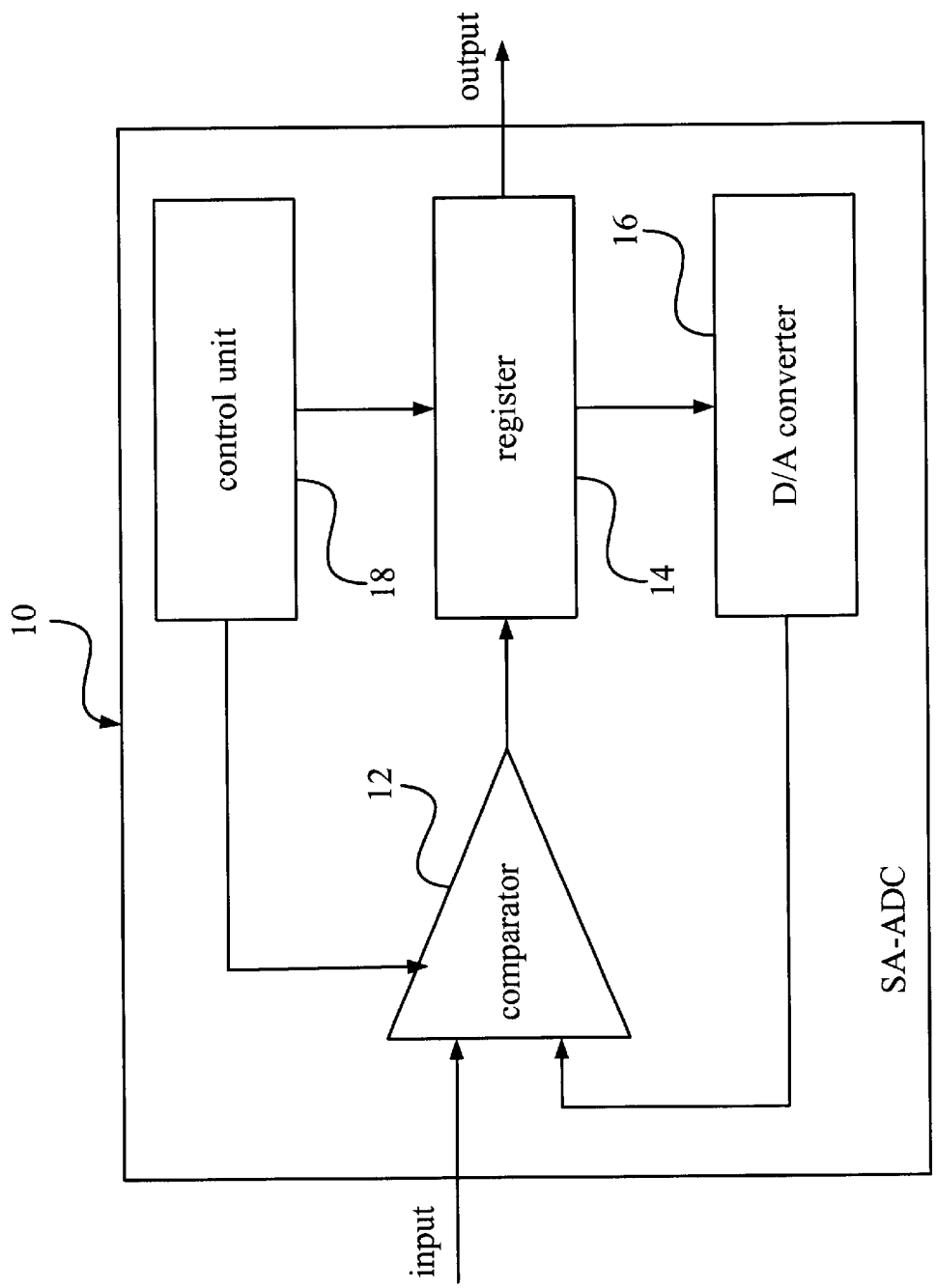
FIG. 1 is a schematic diagram of the SA-ADC of the prior art.
Figure 2:
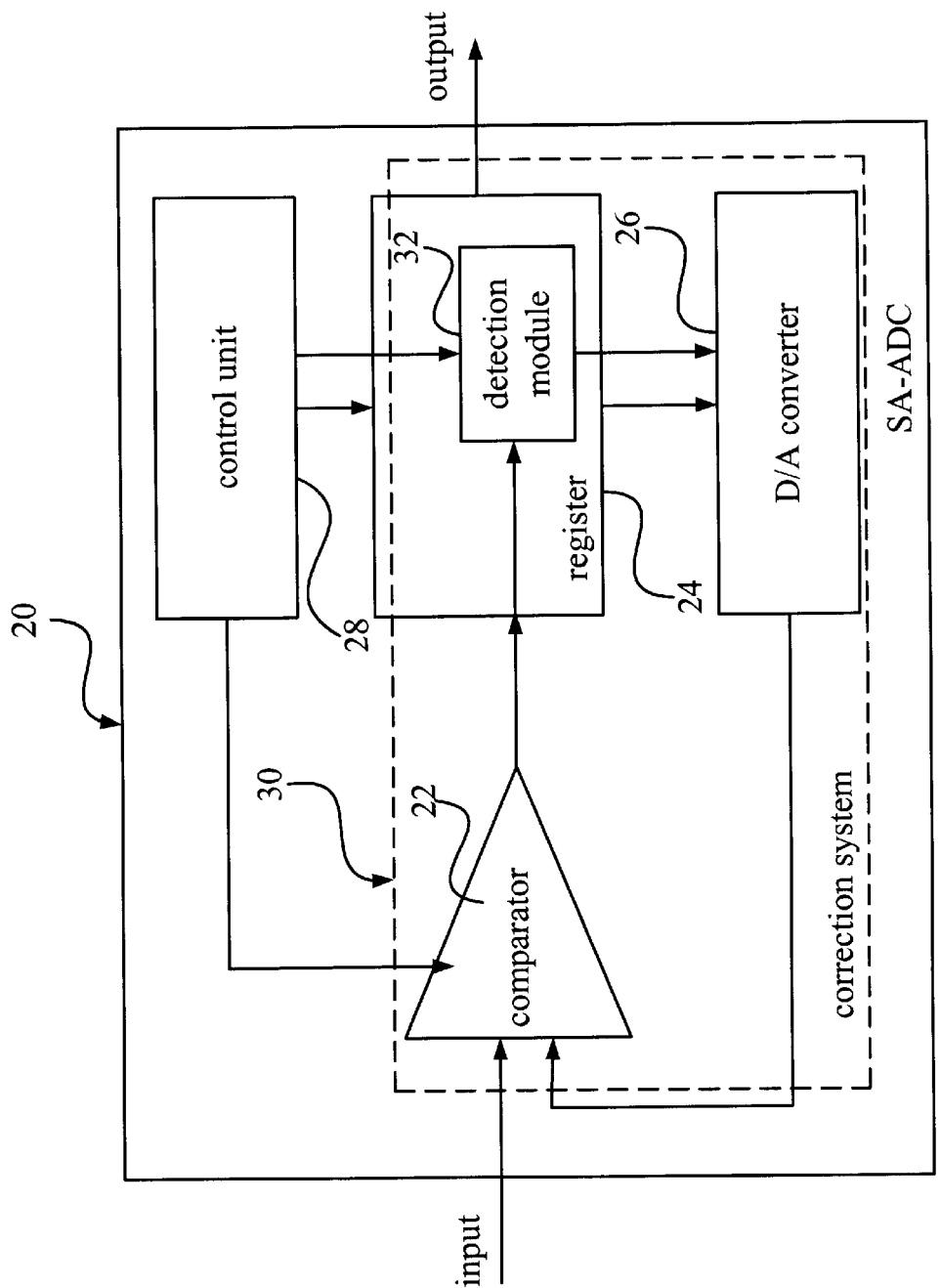
FIG. 2 is a schematic diagram of the application environment of the preferred embodiment according to the present invention.

Please refer to FIG. 2. FIG. 2 is a schematic diagram of the application environment of the preferred embodiment according to the present invention. The present invention is a correction system 30 of a Successive Approximation Analog-to-Digital Converter (SA-ADC) 20. The SA-ADC 20 is used for converting an analog signal with N times during N clocks to generate a digital data. The SA-ADC of the prior art uses the dichotomy to approach the real value. A presupposition of the present invention is that if the SA-ADC compares the analog signal with a wrong value at the i-th converting, the wrong values appear from the i+1-th to the last converting and cannot be corrected. For example, the comparison range of the SA-ADC with 4 bits is 1~2V. If the level of the analog signal is higher than 1.5V, the output value of the SA-ADC of the prior art should be [1000]. At this time, if the SA-ADC mistakes the MSB for [0], the output value of the SA-ADC will be [0111]. In other words, when the SA-ADC makes a mistake, the logic number [1] or [0] appears continuously. (When the logic number [1] or [0] appears continuously, the value may be also correct, e.g. the analog signal is lower than 1.5V within the prior art.) On the other hand, when the logic number [1] and [0] appear by turns within the digital data, the SA-ADC doesn't make any mistake.

Therefore, when the analog signal is converted with N times to generate the digital data $D_i(i=1\sim N)$, which is a series of N logic numbers and has the same M logic numbers $(D_{N-M+1}\sim D_N, 1\leq M<N)$ in the last. The correction system 30 of the present invention is used for detecting if there is any error within the digital data after the digital data is generated, and correcting the digital data. More particularly, the correction system of the present invention is processed by the component within the SA-ADC 20 of the prior art without adding other components. Besides original N clocks for converting, only add another clock for correcting. The SA-ADC 20, which has the correction system 30, comprises a comparator 22, a register 24, a D/A converter 26, and a control unit 28. The process that the SA-ADC 20 converts the analog signal with N times to generate the digital data is the same as the SA-ADC mentioned within the background of the invention. The process is not described again here. The method of the correction system 30 of the present invention will be described in detail in the following.

The control unit 28 of the present invention will correct the digital data with a clock after the SA-ADC 20 converts the analog signal with N clocks. During this one clock, a detection module 32 detects the back bits of the digital data first. As the above, the detection module 32 detects from the LSB toward front whether the digital data has the same M logic numbers to determine if the digital data should be corrected. More particularly, in the preferred embodiment, the detection module 32 is formed within the register 24, but in another embodiment, the detection module 32 is an independent component not included in the register 24.

Therefore, if the M logic numbers are the logic number [1] or the LSB of the digital data is the logic number [1], the detection module 32 proceeds the digital data and a correction data with a first logic operation to generate a first detection digital data. In the embodiment of the present invention, the correction data is the logic number [1] and the first logic operation is an addition operation. For example, if the digital data is [0111], the result that the detection module 32 proceeds the digital data and the logic number [1] with the addition operation is [1000], and this is the first detection digital data. More particularly, the embodiment of the present invention uses the logic number [1] and the addition operation as the operation method to generate the first detection digital data. However, anybody, who knows this technique very well, will easily achieve the effect of the present invention by exchanging the addition operation with repulsion or exclusiveor(XOR) operation but without departing its broader aspect.

If the M logic numbers are the logic number [0] or the LSB of the digital data is the logic number [0], the detection module 32 uses the digital data to detect directly. For example, if the digital data is [1000], the detection module 32 uses the digital data [1000] to detect directly.

As shown in FIG. 2, after the detection module 32 generates the detection data, the detection data is input into the D/A converter 26. If the input is the first detection digital data, the D/A converter 26 is used for converting the first detection digital data to a first detection signal correspondingly. If the input is the digital data, the D/A converter 26 is used for converting the digital data to a second detection signal correspondingly.

As shown in FIG. 2, the first detection signal or the second detection signal generated by the D/A converter 26 is taken as a reference signal of the comparator 22 for compared with the level of the analog signal. For example, the comparator 22 is used for comparing with the respective voltage of the analog signal, the first detection signal, and the second detection signal.

When the reference signal is the first detection signal and if the comparison result is that the analog signal is higher than the first detection signal, the digital data must be wrong and the detection module 32 outputs the first detection digital data to replace the digital data. If the analog signal is lower than the first detection signal, the digital data must be correct and the detection module 32 outputs the digital data.

When the reference signal is the second detection signal and if the comparison result is that the analog signal is higher than the second detection signal, the digital data must be correct and the detection module 32 outputs the digital data. If the analog signal is lower than the second detection signal, the digital data must be wrong and the detection module 32 proceeds the digital data and the correction data with a second logic operation to output a second detection digital data to replace the digital data. In the embodiment of the present invention, the correction data is the logic number [1] and the second logic operation is a subtraction operation. For example, if the digital data is [1000], the result that the detection module 32 proceeds the digital data and the logic number [1] with the subtraction operation is [0111]. The result is the second detection digital data. More particularly, the embodiment of the present invention uses the logic number [1] and the subtraction operation as the operation method to generate the first detection digital data. However, anybody, who knows this technique very well, will easily achieve the effect of the present invention by exchanging the subtraction operation with repulsion or exclusiveor operation but without departing in its broader aspect.

As shown in FIG. 2, the digital data is buffered in the register 24. After the correction system 30 of the present invention detects the digital data, if the digital data is wrong, the detection module 32 inputs the first detection digital data or the second detection digital data into the register 24 to replace the digital data buffered therein.

For example, a SA-ADC has 4 bits resolution. The comparison range of the SA-ADC is 1~2V and the input analog signal is 1.51V are assumed. If the SA-ADC has 4 bits resolution is an ideal SA-ADC, the comparison level of the first converting should be the middle value of the comparison range: 1.5V, and the result should be the logic number [1]. (Because 1.51V is higher than 1.5V.) According to this result, the comparison level of the second converting should be the middle value of 1.5V and 2V: 1.75V, and the result should be the logic number [0]. According to the above result, the comparison level of the third converting should be the middle value of 1.75V and 1.5V: 1.625V, and the result should be the logic number [0]. According to the above result, the comparison level of the last converting should be the middle value of 1.625V and 1.5V : 1.5625V, and the result should be the logic number [0]. Normally, a half of the last comparison level, the ±0.5 LSB, is the accuracy of the comparator.

According to the above, the order of the comparison level of the analog signal is 1.5V, 1.75V, 1.625V, and 1.5625V. The output digital data should be [1000]. However, if the settling time of the D/A converter inside the SA-ADC is not ideal and due to the settling time is not enough, the output voltage of D/A converter inside the SA-ADC will be larger than the ideal value: 0.5 LSB (0.03125). The comparison level of the first converting of the above becomes 1.53125V, and the order of the comparison level of the signal becomes 1.53125V, 1.25V, 1.375V, and 1.4375V. Therefore, the output digital data becomes [0111] instead of [1000]. The situation is more obvious when the input signal is close to the output level of the D/A converter.

At this time, the correction system of the present invention will detect if there are continuous [1]s or [0]s in the back bit of the output digital data. Because the output digital data in this embodiment is [0111], the correction system will compare with the level of [1000] (the digital data plus [1]) again and the order of the comparison level of the signal becomes 1.53125V, 1.25V, 1.375V, 1.4375V, and 1.5V. (The settling time of 1.5V level will be lower than the previous comparison when correcting because the gap of voltage is decreased.) At this time, the D/A converter can achieve the best resolution (more closely to 1.5V). If the input signal is higher than the level of [1000] (the digital data plus [1]), the [1000] is a correct digital data. If the input signal is lower than the level of [1000] (the digital data plus [1]), the [0111] is a correct digital data. On the contrary, if there are continuous [0]s in the digital data, the digital data is processed according to the above method.

When the particular conditions happen, the operation method of the correction system 30 of the present invention is described in the following description. The first particular condition is that the digital data is N logic numbers [1]. Under this condition, because the digital data has been the highest value, the above operation method cannot be applied to this condition. (The digital data cannot add the logic number [1].) The present invention applies a particular method to correct the digital data. The detection module 32 uses the digital data to detect directly and inputs the digital data into the D/A converter 26. The D/A converter 26 converts the digital data to a third detection signal. The comparator 22 compares the third detection signal with the level of the analog signal. If the analog signal is higher than the third detection signal, the detection module 32 outputs the digital data. If the analog signal is lower than the third detection signal, the detection module 32 proceeds the digital data and the logic number [1] with a subtraction operation to output a third detection digital data to replace the digital data. For example, [1111] minus [1] leaves [1110].

The second particular condition is that the digital data is N logic numbers [0]. Under this condition, the above operation method of the correction system 30 of the present invention may be applied to correct the condition. But because the digital data has been the lowest value, the method of generating the detection digital data to replace the digital data is a little different in the last. The present invention applies the particular method to correct the digital data. The detection module 32 uses the digital data to detect directly and outputs the digital data to the D/A converter 26. The D/A converter 26 converts the digital data to a fourth detection signal. The comparator 22 compares the fourth detection signal with the analog signal. If the analog signal is lower than the fourth detection signal, the detection module 32 outputs the digital data. If the analog signal is higher than the fourth detection signal, the detection module 32 proceeds the digital data and the logic number [1] with an addition operation to output a fourth detection digital data to replace the digital data. For example, [0000] plus [1] equals [0001].

Figure 3:
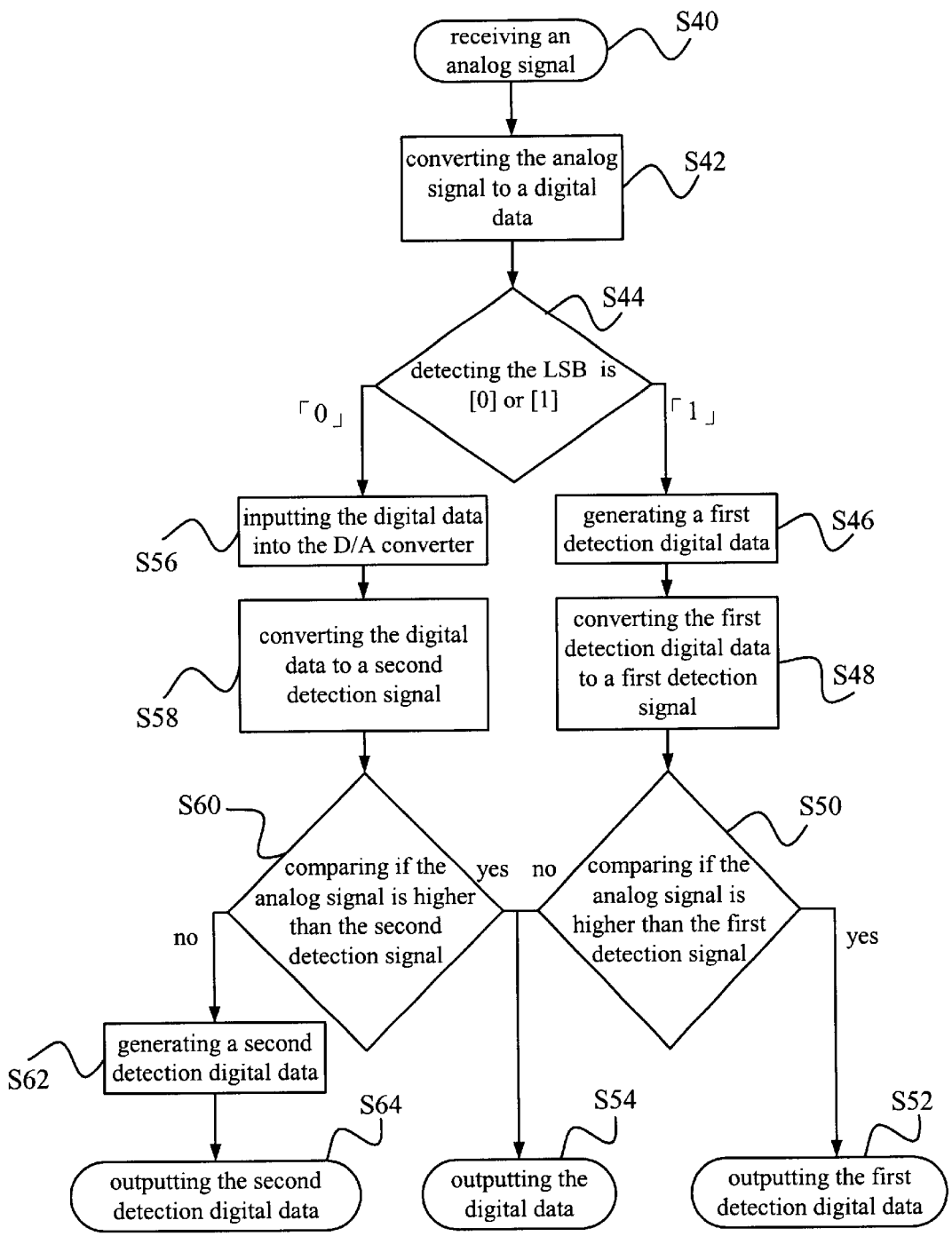
FIG. 3 is a flowchart of the correction method of the present invention.

Please refer to FIG. 3. FIG. 3 is a flowchart of the correction method of the present invention. According to the above, the correction method of the present invention comprises the following steps:

Step S40: starting and receiving an analog signal.

Step S42: converting the analog signal to a digital data by the SA-ADC 20.

Step S44: detecting the LSB of the digital data is the logic number [0] or [1] by the detection module 32. If the LSB is the logic number [1], proceeding step S46; if the LSB is the logic number [0], proceeding step S56.

Step S46: proceeding the digital data and the logic number [1] with an addition operation to generate a first detection digital data.

Step S48: converting the first detection digital data to a first detection signal by the D/A converter 26.

Step S50: comparing the first detection signal with the level of the analog signal by the comparator 22. If the analog signal is higher than the first detection signal, proceeding step S52; if the analog signal is lower than the first detection signal, proceeding step S54.

Step S52: outputting the first detection digital data to replace the digital data.

Step S54: outputting the digital data.

Step S56: inputting the digital data into the D/A converter 26.

Step S58: converting the digital data to a second detection signal by the D/A converter 26.

Step S60: comparing the second detection signal with the level of the analog signal by the comparator 22. If the analog signal is higher than the second detection signal, proceeding step S54; if the analog signal is lower than the second detection signal, proceeding step S62.

Step S62: proceeding the digital data and the logic number [1] with a subtraction operation to generate a second detection digital data.

Step S64: outputting the second detection digital data to replace the digital data.

According to the above, to increase the settling time of the A/D converter within the SA-ADC to improve the accuracy thereof, the present invention adds a correction system to the SA-ADC of the prior art and increases a clock to correct. The SA-ADC proceeds one more comparison after being stable sufficiently to output an accurate digital data. Therefore, the problems resulted from that the SA-ADC of the prior art lacks the correction system are avoided. Because the present invention adds one clock directly under the structure of the SA-ADC of the prior art, the control logic is more simplified than the prior art. Extending the correction clock, which increases the time for the stability of the D/A converter, may further reduce the request of the D/A converter. Besides, the correction system of the present invention aims to correct the digital data of the whole SA-ADC, so the accuracy of the data output from the SA-ADC can be ensured.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A correction system of Successive Approximation Analog-to-Digital Converter (SA-ADC), the converter being used for converting an analog signal to a digital data, the digital data being a series of logic numbers $D_i$ (i=1~N) and having the same M logic numbers ($D_{N-M+1} \sim D_N$, $1 \leq M < N$) in the last, the correction system being used for detecting if there is any error within the digital data after the digital data being generated and correcting the digital data, the correction system comprising:

a detection module for
if the M logic numbers all are logic number [1], proceeding the digital data and a correction data with a first logic operation to generate a first detection digital data; and
if the M logic numbers all are logic number [0], using the digital data to detect directly;

a D/A converter for
inputting the first detection digital data or the digital data, and correspondingly converting to a first detection signal or a second detection signal; and a comparator for
using the first detection signal or the second detection signal as a reference signal of the comparison module to compare with the analog signal;

wherein when the reference signal is the first detection signal,
if the analog signal is higher than the first detection signal, the detection module outputs the first detection digital data to replace the digital data; and
if the analog signal is lower than the first detection signal, the detection module outputs the digital data; and wherein when the reference signal is the second detection signal,
if the analog signal is higher than the second detection signal, the detection module outputs the digital data; and
if the analog signal is lower than the second detection signal, the detection module proceeds the digital data and the correction data with a second logic operation to output a second detection digital data to replace the digital data.

2. The correction system of claim 1, wherein the correction data is logic number [1].

3. The correction system of claim 1, wherein the first logic operation is an addition operation.

4. The correction system of claim 1, wherein the second logic operation is a subtraction operation.

5. The correction system of claim 1, wherein the converter comprises a register for buffering the digital data and receiving the first detection digital data or the second detection digital data input and corrected by the detection module to replace the digital data buffered therein.

6. The correction system of claim 1, wherein the comparator is used for comparing with the respective voltage of the analog signal, the first detection signal, and the second detection signal.

7. The correction system of claim 1, for detecting if there is any error within the digital data during a clock.

8. The correction system of claim 1, wherein when the digital data is N logic numbers [1], then the detection module using the digital data to detect directly;

the D/A converter converting the digital data to a third detection signal;

the comparator comparing the third detection signal with the analog signal;

if the analog signal is higher than the third detection signal, the detection module outputs the digital data; and if the analog signal is lower than the third detection signal, the detection module proceeds the digital data and logic number [1] with a subtraction operation to output a third detection digital data to replace the digital data.

9. The correction system of claim 1, wherein when the digital data is N logic numbers [0], then the detection module using the digital data to detect directly;

the D/A converter converting the digital data to a fourth detection signal;

the comparison module comparing the fourth detection signal with the analog signal;

if the analog signal is higher than the fourth detection signal, the detection module proceeds the digital data and logic number [1] with an addition operation to output a fourth detection digital data to replace the digital data; and if the analog signal is lower than the fourth detection signal, the detection module outputs the digital data.

10. A correction method of SA-ADC, the converter being used for converting an analog signal to a digital data, the digital data being a series of N logic numbers $D_i(i=1\sim N)$ and having the same M logic numbers ($D_{N-M+1}\sim D_N$, $1 \leq M<N$) in the last, after the digital data being generated, the correction system being used for detecting if there is any error within the digital data and correcting the digital data, the correction system comprising:

if the M logic numbers are logic number [1], proceeding the digital data and a correction data with a logic operation to generate a detection digital data;

converting the detection digital data to a detection signal;

comparing the detection signal with the analog signal;

if the analog signal is higher than the detection signal, outputting the detection digital data to replace the digital data; and if the analog signal is lower than the detection signal, outputting the digital data.

11. The correction method of claim 10, wherein correction data is logic number [1].

12. The correction method of claim 10, wherein the logic operation is an addition operation.

13. The correction method of claim 10, wherein the step of comparison is to compare with the respective voltage of the analog signal and the detection signal.

14. The correction method of claim 10, for detecting if there is any error within the digital data during a clock.

15. The correction method of claim 10, wherein when the digital data is N logic numbers [1], the correction method comprises the following steps:

using the digital data to detect directly;

converting the digital data to a third detection signal;

comparing the third detection signal with the analog signal;

if the analog signal is higher than the third detection signal, outputting the digital data; and if the analog signal is lower than the third detection signal, proceeding the digital data and logic number [1] with a subtraction operation to output a third detection digital data to replace the digital data.

16. A correction method of SA-ADC, the converter being used for converting an analog signal to a digital data, the digital data being a series of N logic numbers $D_i(i=1\sim N)$ and having the same M logic numbers ($D_{N-M+1}\sim D_N$, $1 \leq M<N$) in the last, after the digital data being generated, the correction system being used for detecting if there is any error within the digital data and correcting the digital data, the correction system comprising:

if the M logic numbers all are logic number [0], using the digital data to detect directly;

converting the digital data to a detection data;

comparing the detection signal with the analog signal;

if the analog signal is higher than the detection signal, outputting the digital data; and if the analog signal is lower than the detection signal, proceeding the digital data and a correction data with a logic operation to output a detection digital data to replace the digital data.

17. The correction method of claim 16, wherein the correction data is logic number [1].

18. The correction method of claim 16, wherein the logic operation is a subtraction operation.

19. The correction method of claim 16, wherein the step of comparison is to compare with the respective voltage of the analog signal and the detection signal.

20. The correction method of claim 10, for detecting if there is an error within the digital data during a clock.

21. The correction method of claim 16, wherein when the digital data is N logic numbers [0], then the correction method comprises the following steps:

using the digital data to detect directly;

converting the digital data to a fourth detection signal;

comparing the fourth detection signal with the analog signal;

if the analog signal is higher than the fourth detection signal, proceeding the digital data and logic number [1] with an addition operation to output a fourth detection digital data to replace the digital data; and if the analog signal is lower than the fourth detection signal, outputting the digital data.

* * * * *